United States Patent
Okuda et al.

(10) Patent No.: US 7,649,796 B2
(45) Date of Patent: Jan. 19, 2010

(54) SEMICONDUCTOR MEMORY AND OPERATING METHOD OF SAME

(75) Inventors: Masaki Okuda, Kawasaki (JP); Atsushi Fujii, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 193 days.

(21) Appl. No.: 12/005,389

(22) Filed: Dec. 27, 2007

(65) Prior Publication Data

US 2008/0159041 A1    Jul. 3, 2008

(30) Foreign Application Priority Data

Dec. 27, 2006   (JP)   ............... 2006-352454

(51) Int. Cl.
*G11C 7/00* (2006.01)
(52) U.S. Cl. .................. 365/222; 365/195; 365/201
(58) Field of Classification Search ............... 365/222, 365/201, 191, 195, 233.1
See application file for complete search history.

(56) References Cited

U.S. PATENT DOCUMENTS

| | | | | |
|---|---|---|---|---|
| 6,751,144 B2* | 6/2004 | Takahashi et al. | ........... | 365/222 |
| 6,947,338 B2* | 9/2005 | Sato | ............ | 365/189.05 |
| 7,072,243 B2* | 7/2006 | Nakamura et al. | ....... | 365/233.5 |
| 7,113,441 B2* | 9/2006 | Shinozaki et al. | ........... | 365/222 |
| 7,433,996 B2* | 10/2008 | Fang et al. | ............ | 711/106 |
| 2004/0199717 A1 | 10/2004 | Kanda et al. | | |
| 2006/0023547 A1 | 2/2006 | Nakamura et al. | | |

FOREIGN PATENT DOCUMENTS

| | | |
|---|---|---|
| EP | 1 235 228 A1 | 8/2002 |
| EP | 1 542 237 A1 | 6/2005 |
| JP | 2005-092978 A | 4/2005 |
| JP | 2006-059489 A | 3/2006 |

* cited by examiner

*Primary Examiner*—Tuan T Nguyen
*Assistant Examiner*—Hien N Nguyen
(74) *Attorney, Agent, or Firm*—Arent Fox LLP

(57) ABSTRACT

A semiconductor memory has a memory cell array having dynamic memory cells. An access control circuit accesses the memory cells in response to an access command which is supplied externally. A refresh control circuit generates, during a test mode, a test refresh request signal in synchronization with the access command so as to execute a refresh operation of the memory cells when a refresh mask signal is at an invalid level. Also, the refresh control circuit prohibits generation of the test refresh request signal when the refresh mask signal is at a valid level. The test refresh request signal is generated or prohibited from being generated according to the level of the refresh mask signal. Thus, only a refresh operation needed for a test can be executed, and hence test efficiency can be improved.

15 Claims, 16 Drawing Sheets

SEMICONDUCTOR MEMORY AND OPERATING METHOD OF SAME

CROSS-REFERENCE TO RELATED APPLICATION

This application is based upon and claims the benefit of priority from Japanese Patent Application No. 2006-352454, filed on Dec. 27, 2006, the entire content of which is incorporated herein by reference.

BACKGROUND

1. Field

The present invention relates to a semiconductor memory having memory cells of DRAM and an interface of SRAM.

2. Description of the Related Art

A pseudo SRAM has memory cells of DRAM (dynamic memory cells) and operates as SRAM by internally and automatically executing a refresh operation of memory cells. The pseudo SRAM executes the refresh operation without being recognized by a controller such as CPU, during a period in which a read operation or a write operation of a memory core is not executed. The refresh operation is executed in response to an internal refresh request which occurs periodically inside the pseudo SRAM.

When the internal refresh request conflict with an external access request, the refresh operation is executed with higher priority than an access operation (read operation or write operation). At this time, to make it possible to insert the refresh operation during an access cycle, an access cycle time, which is a minimum supply interval for an access command (read command or write command), is set to a time obtained by adding a refresh operation time of the memory core to a read operation time or a write operation time of the memory core.

An effective value of a read access time from supplying of a read command to outputting of read data, and an effective value of a write access time from supplying of a write command to writing of write data to a memory cell becomes worst when the refresh operation is inserted. In a test of the pseudo SRAM, it is necessary to evaluate a worst access time. Since the generation period of the internal refresh request is much longer than that of the access cycle time, it is difficult to insert the refresh operation during an access cycle efficiently to evaluate the worst access time. Accordingly, there is proposed a technique in which a test mode is provided in the pseudo SRAM, and a refresh request is generated forcibly in synchronization with an access command during the test mode (for example, Japanese Unexamined Patent Application Publication No. 2005-92978). Also, there is proposed a technique in which a refresh operation is executed just before or after an access operation in response to an internal refresh request or an externally supplied trigger signal (for example, Japanese Unexamined Patent Application Publication No. 2006-59489).

Conventionally, a refresh operation during the test mode is always executed together with an access operation in response to an access request. Since the refresh operation that is normally unnecessary is performed, the access cycle time cannot be shortened, thereby resulting in poor test efficiency.

SUMMARY

According to one of the aspect of an embodiment, a semiconductor memory has a memory cell array having dynamic memory cells. An access control circuit accesses the memory cells in response to an access command which is supplied externally. A refresh control circuit generates, during a test mode, a test refresh request signal in synchronization with the access command so as to execute a refresh operation of the memory cells when a refresh mask signal is at an invalid level. Also, the refresh control circuit prohibits generation of the test refresh request signal when the refresh mask signal is at a valid level.

According to another of the aspect of an embodiment, the semiconductor memory has a data mask terminal which receives a data mask signal which masks a data signal inputted to or outputted from a data terminal. The data mask terminal functions as a refresh mask terminal which receives the refresh mask signal when the access command is received during the test mode. The refresh control circuit operates according to the refresh mask signal supplied to the mask terminal. Using the data mask terminal as a multipurpose terminal for the data mask signal and the refresh mask signal, a dedicated terminal to receive the refresh mask signal can be dispensed with. Consequently, without increasing the chip size of the semiconductor memory, only the refresh operation needed for a test can be executed, and hence the test efficiency can be improved.

According to other of the aspect of an embodiment, a specification of an access cycle time which is a supply interval of the access command is set to a time in which one refresh operation can be executed in addition to one read operation or one write operation during a normal operation mode. During a test mode, a specification of an access cycle time when the refresh mask signal is at the invalid level is set equal to the access cycle time of the normal operation mode, and a specification of an access cycle time when the refresh mask signal is at the valid level is set shorter than the access cycle time of the normal operation mode by a time in which a refresh operation is not executed. Thus, by shortening the access cycle time when the refresh operation is not needed, a test time can be shortened, and test efficiency can be improved.

DETAILED DESCRIPTION OF THE EMBODIMENTS

Figure 1:
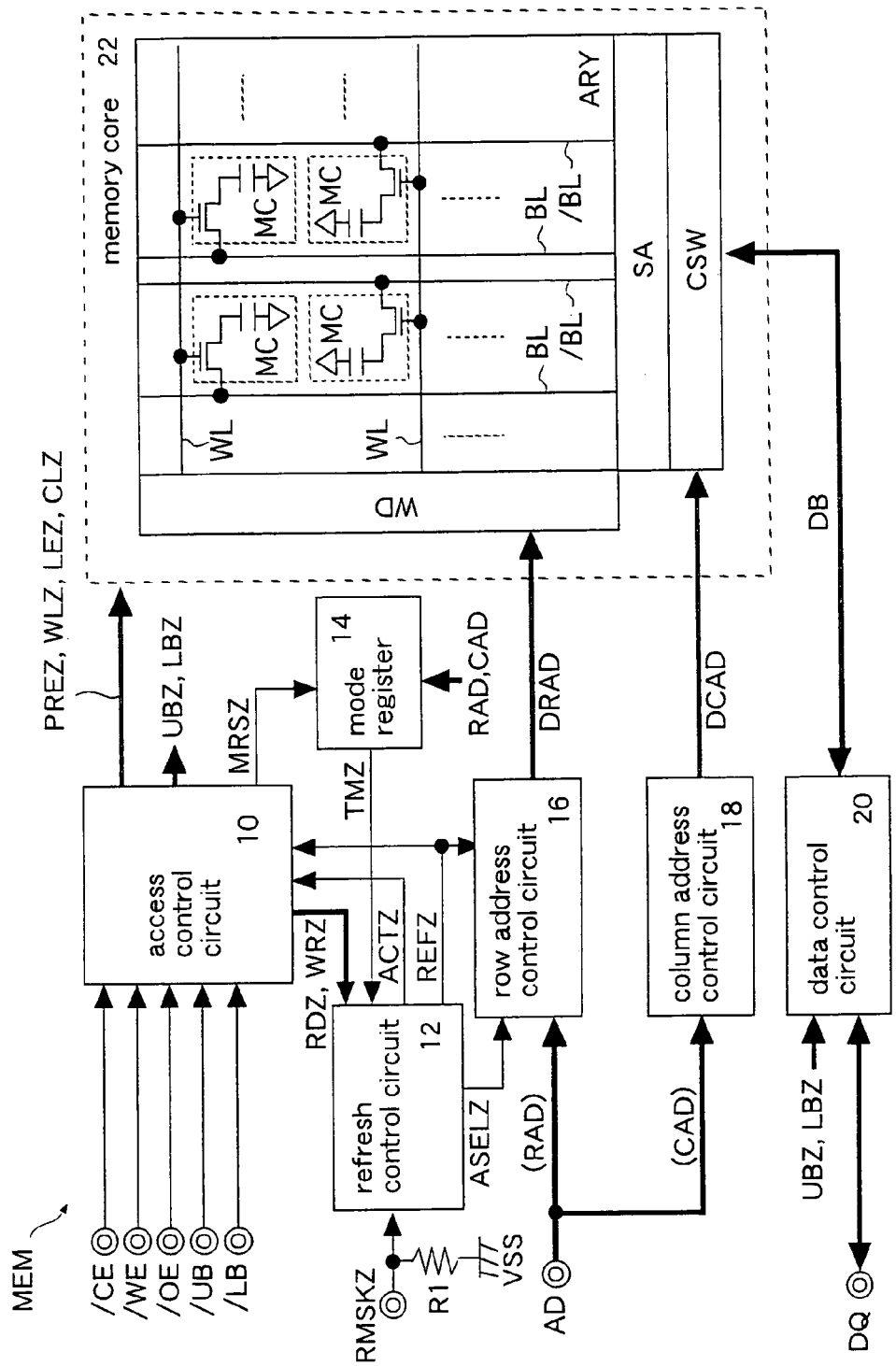
FIG. 1 is a block diagram showing an embodiment of the present invention.

Hereinafter, embodiments of the present invention will be described, using the drawings. In the drawings, each signal line shown by the heavy line is constituted of a plurality of lines. Further, part of blocks to which the heavy lines are connected is constituted of a plurality of circuits. Each signal line through which the signal is transmitted is denoted by the same reference symbol as the signal name. Each signal starting with "/" represents negative logic. Each signal ending with "Z" represents positive logic. Each double circle in the drawings represents an external terminal.

FIG. 1 shows an embodiment of the present invention. A semiconductor memory MEM is, for example, an FCRAM (Fast Cycle RAM) with an asynchronous clock. The FCRAM is a pseudo SRAM which has memory cells of DRAM and has an interface of SRAM. The memory MEM has an access control circuit 10, a refresh control circuit 12, a mode register 14, a row address control circuit 16, a column address control circuit 18, a data control circuit 20 and a memory core 22.

The access control circuit 10 receives at an external terminal a control signal (chip enable signal /CE, write enable signal /WE, output enable signal /OE, upper-byte control signal /UB, lower-byte control signal /LB) for causing the memory MEM to perform an access operation. Also, the access control circuit 10 receives an active signal ACTZ for causing the memory MEM to execute a read operation or a write operation and a refresh control signal REFZ for causing the memory MEM to execute a refresh operation. The access control circuit 10 outputs, according to a received control signal, a read control signal RDZ, a write control signal WRZ or a mode register set signal MRSZ and data control signals UBZ, LBZ, and outputs, according to the received active signal ACTZ or refresh control signal REFZ, a precharge control signal PREZ, a word control signal WLZ, a sense amplifier activation signal LEZ, a column control signal CLZ. The read control signal RDZ (read command, read request) is outputted when a read command RD is supplied from the outside of the memory MEM. The write control signal WRZ (write command, write request) is outputted when a write command WR is supplied from the outside of the memory MEM. Details of the access control circuit 10 will be explained with FIG. 2 and FIG. 3.

The refresh control circuit 12 outputs the active signal ACTZ in response to the read command RDZ or the write command WRZ, and outputs the refresh control signal REFZ in response to a refresh request (RREQ0Z in FIG. 2) which is generated by itself. However, the refresh control circuit 12 judges, when the read command RDZ or the write command WRZ conflicts with the refresh request, which of a read operation or write operation and a refresh operation is to be executed first, and outputs the active signal ACTZ and the refresh control signal REFZ sequentially according to the determined order. Also, the refresh control circuit 12 outputs an address selection signal ASELZ during execution of the refresh operation.

The refresh control circuit 12 prohibits the output of the refresh control signal REFZ in response to a refresh request signal RREQ0Z while a test mode signal TMZ is activated (during a test mode), and outputs the refresh control signal REFZ in response to the read command RDZ or the write command WRZ. However, the refresh control circuit 12 prohibits the output of the refresh control signal REFZ in response to the read command RDZ or the write command WRZ when a refresh mask signal RMSKZ is activated.

Figure 3:
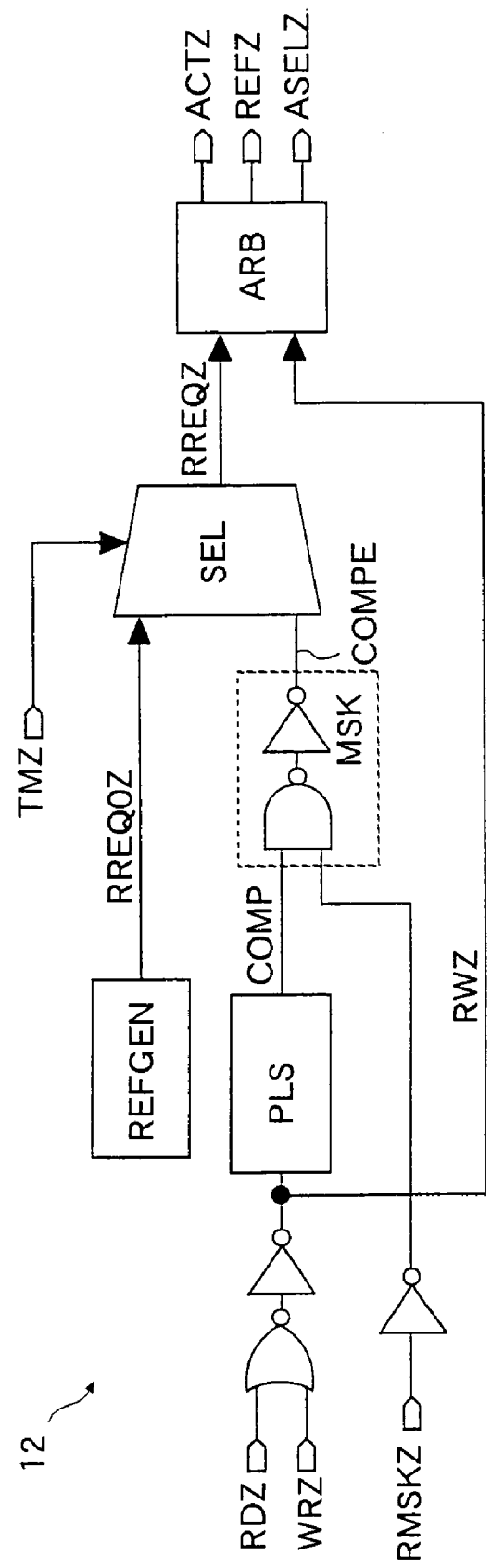
FIG. 3 is a block diagram showing details of a refresh control circuit shown in FIG. 1.
Figure 6:
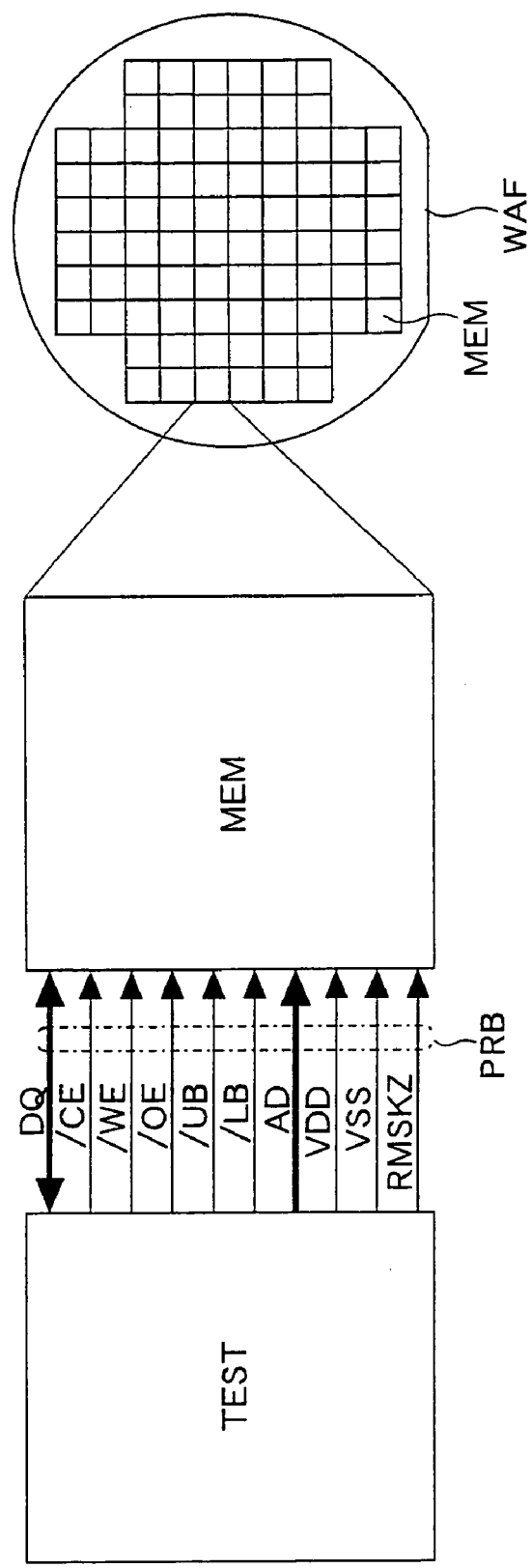
FIG. 6 is a block diagram showing a test environment of the embodiment.
Figure 8:
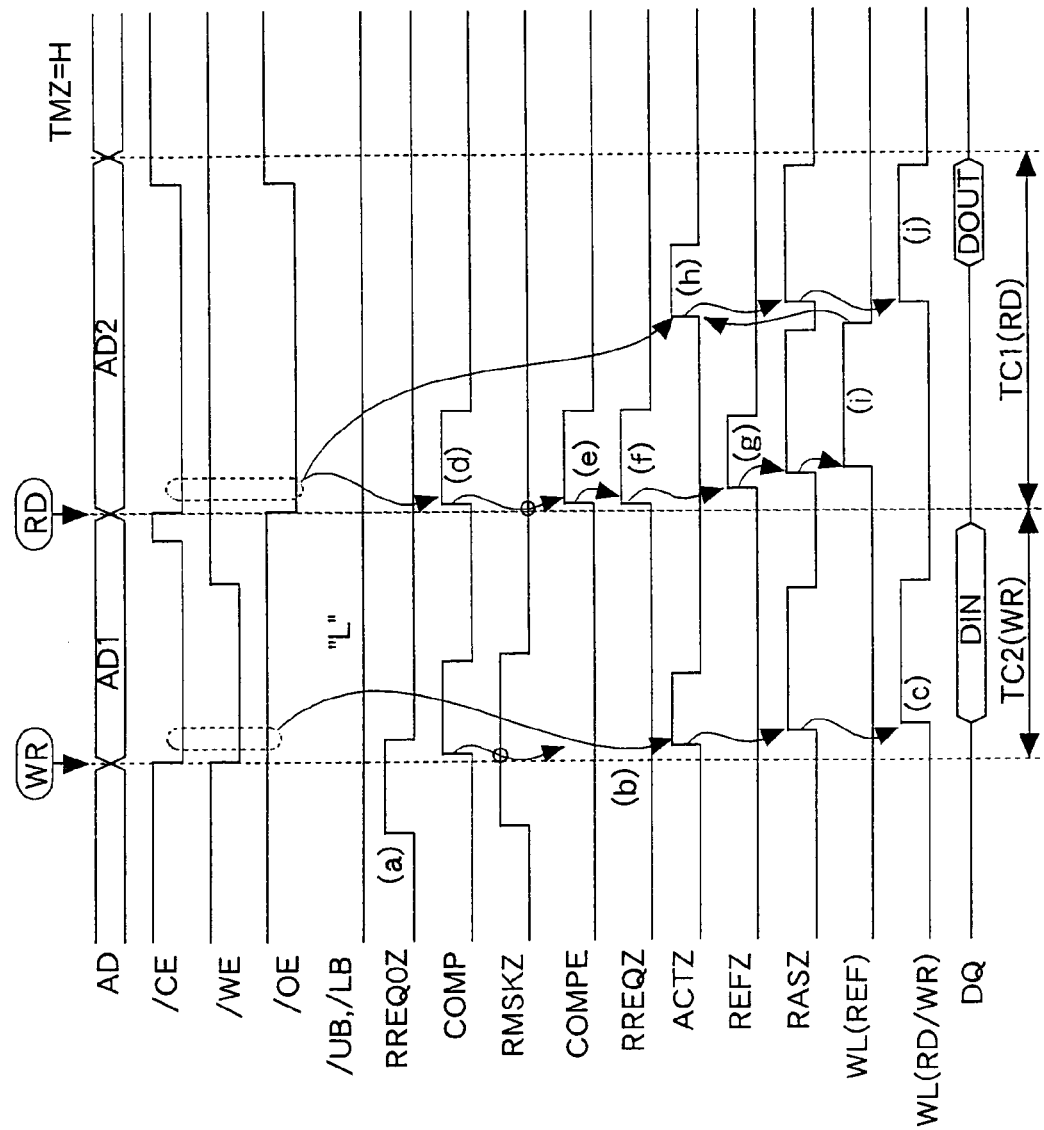
FIG. 8 is a timing chart showing one example of operations of the memory in a test mode in the embodiment.
Figure 9:
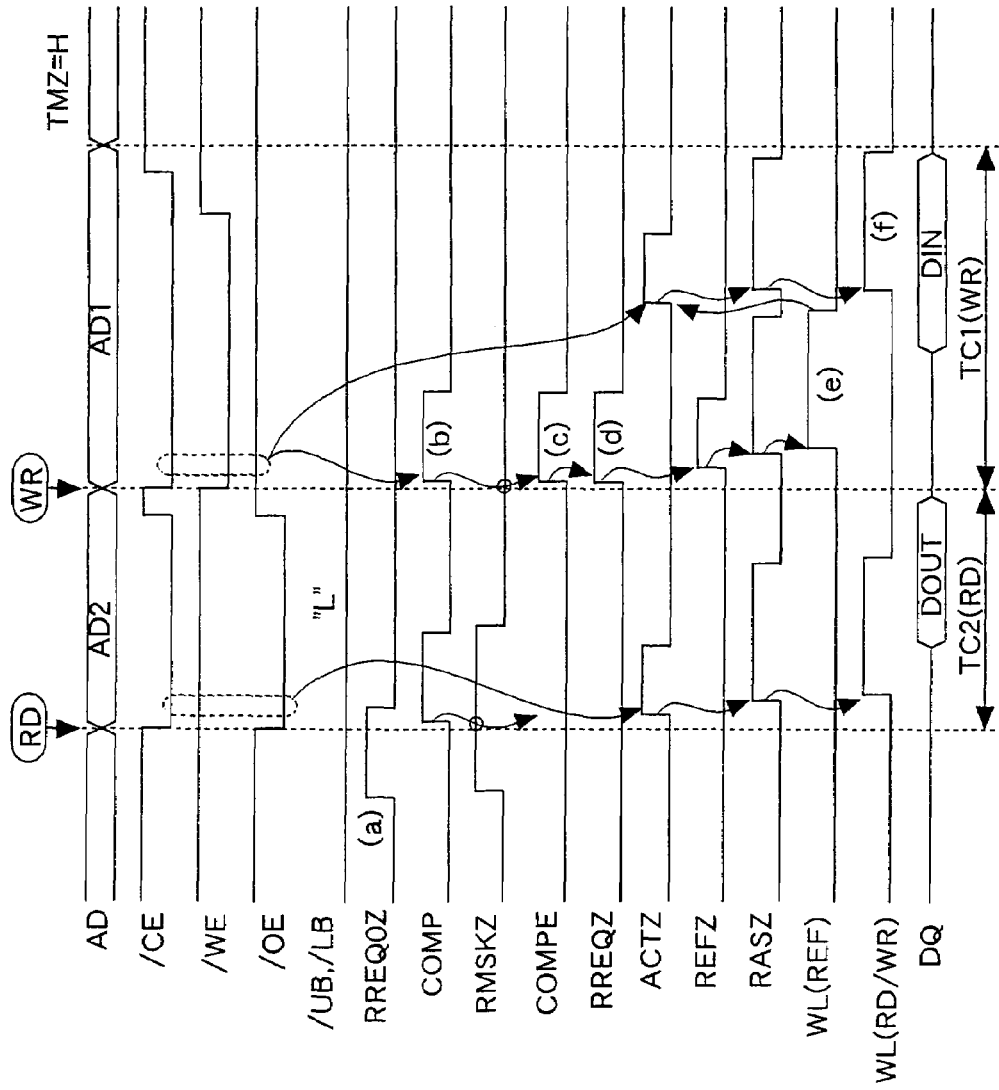
FIG. 9 is a timing chart showing another example of operations of the memory in the test mode in the embodiment.

A refresh mask terminal RMSKZ is a dedicated terminal for receiving the refresh mask signal RMSKZ, and is formed as a test pad for example. The test pad is, as shown in FIG. 6, a terminal for connecting a probe PRB of an LSI tester TEST when the memory MEM in a wafer state WAF is tested. The refresh mask terminal RMSKZ is not connected to an external terminal (lead) of the packaged memory MEM as different from other control terminals. The refresh mask terminal RMSKZ is connected to a ground line VSS via a resistor R1. Accordingly, in the packaged memory MEM, the refresh mask signal RMSKZ is always inactivated. Details of the refresh control circuit 12 are shown in FIG. 3. Also, operations of the test mode are shown in FIG. 8 and FIG. 9.

The mode register 14 is set according to values of address signals RAD, CAD supplied in synchronization with the mode register set signal MRSZ. The mode resister 14 activates the test mode signal TMZ to a high logic level when a predetermined bit (test mode bit) in the address signals RAD, CAD indicates entry to the test mode. By the activation of the test mode signal TMZ, the memory MEM changes from a normal operation mode to the test mode. The mode register 14 inactivates the test mode signal TMZ to a low logic level when the test mode bit indicates exit from the test mode. By the inactivation of the test mode signal TMZ, the memory MEM returns from the test mode to the normal operation mode. Note that the test mode bit of the mode register 14 is reset when the power of the memory MEM is turned on, and inactivates the test mode signal TMZ. Thus, the operation mode of the memory MEM is set to the normal operation mode when the power is turned on. The mode register 14 has bits for setting other operation modes of the memory MEM.

The row address control circuit 16 decodes a row address signal RAD supplied to an address terminal AD in synchronization with a read command or a write command, and outputs this signal as a row decode signal DRAD. Also, the row address control circuit 16 decodes a refresh address signal (RXAD signal in FIG. 4) generated by itself when a refresh operation is executed (ASELZ signal=high logic level), and outputs this signal as a row decode signal DRAD. The column address control circuit 18 decodes a column address signal CAD supplied to the address terminal AD in synchronization with a read command or a write command, and outputs this signal as a column decode signal DCAD. This memory MEM is a memory of address non-multiplex type in which the row address signal RAD and the column address signal CAD are supplied simultaneously.

The data control circuit 20 receives a write data signal at a data terminal DQ, and outputs the received data signal to a column switch CSW via a data bus DB. Also, the data control circuit 20 receives a read data signal from a memory cell MC via the data bus DB, and outputs the received data signal to the data terminal DQ. The data terminal DQ is constituted of 16 bits (2 bytes) for example. A data signal DQ0-7 of the lower one byte is inputted/outputted while the lower-byte control signal /LB (data mask signal) is activated. Similarly, a data signal DQ7-15 of the higher one byte is inputted/outputted while the upper-byte control signal /UB (data mask signal) is activated. In other words, input/output of the data signal DQ0-7 is masked while the lower-byte control signal /LB is inactivated, and input/output of the data signal DQ8-15 is masked while the upper-byte control signal /UB is inactivated.

The memory core 22 has a memory cell array ARY, a word decoder WS, a sense amplifier SA, a column switch CSW and a not-shown precharge circuit. The memory cell array ARY has a plurality of dynamic memory cells MC, word lines WL connected to memory cells MC which are arranged in one direction, and bit lines BL, /BL connected to memory cells MC which are arranged in a direction orthogonal to the one direction. The memory cells MC have a capacitor for retaining data as an electric charge and a transfer transistor for connecting one end of the capacitor to the bit line BL (or /BL). The other end of the capacitor is connected to a precharge voltage line or an internal power supply line. Gates of the transfer transistors are connected to the word lines WL.

Figure 5:
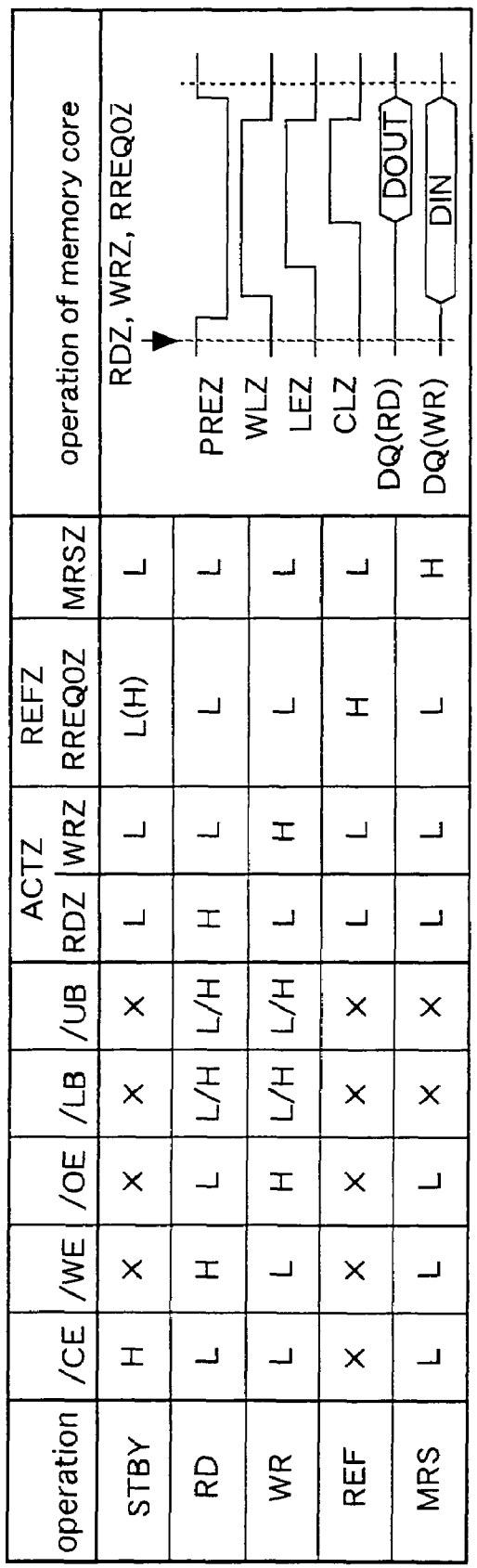
FIG. 5 is an explanatory table showing an overview of operations of a semiconductor memory of the embodiment.

The word decoder WD selects one of the word lines WL according to the row decode signal DRAD. The word lines WL are selected while the word control signal WLZ is activated. The sense amplifier SA amplifies a difference in signal amounts of data signals read to a pair of the bit lines BL, /BL. The sense amplifier SA executes an amplification operation while the sense amplifier activation signal LEZ is activated. The column switch CSW turns on according to a column decode signal DCAD, and connects the bit lines BL, /BL to the data bus DB via a read amplifier and a write amplifier which are not shown. The column switch CSW turns on while the column control signal CLZ is activated. The not-shown precharge circuit has a switch which turns on while the precharge control signal PREZ is activated (when the memory cells MC are not accessed), and connects the bit lines BL, /BL to the precharge voltage line. The overview of operations of the memory core 22 is shown in FIG. 5.

Figure 2:
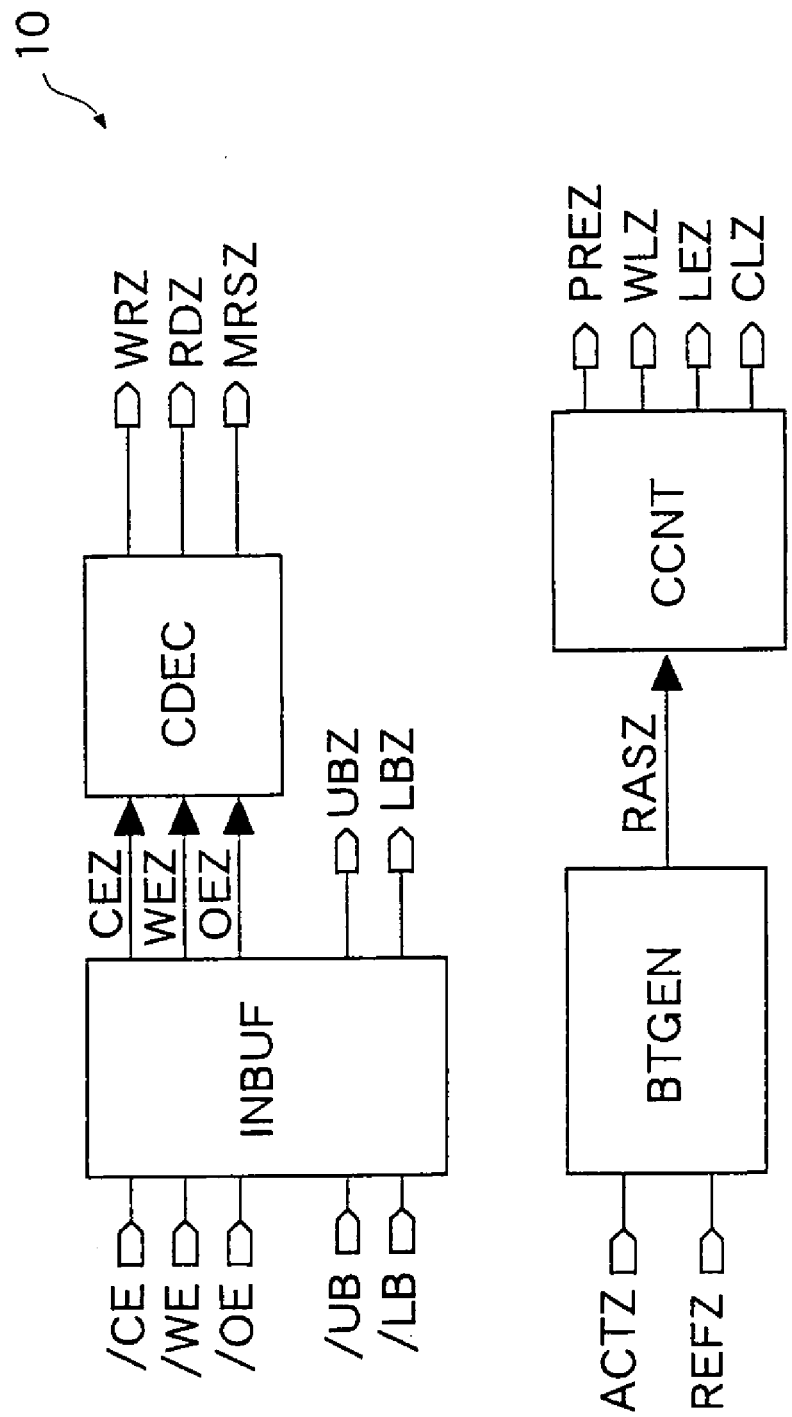
FIG. 2 is a block diagram showing details of an access control circuit shown in FIG. 1.

FIG. 2 shows details of the access control circuit 10 shown in FIG. 1. The access control circuit 10 has an input buffer INBUF, a command decoder CDEC, a basic timing generating circuit BTGEN and a core control circuit CCNT.

The input buffer INBUF receives the /CE signal, the /WE signal, the /OE signal, the /UB signal and the /LB signal, and inverts the logic levels of the received signals and outputs these signals as internal control signals CEZ, WEZ, OEZ, UBZ and LBZ. The command decoder CDEC recognizes a command according to the logic level of the internal control signal CEZ, WEZ, OEZ and outputs, according to the recognized command, the read control signal RDZ (read command), the write control signal WRZ (write command) or the mode register set signal MRSZ. The read command and the write command are external access commands for executing an access operation of the memory core 22.

The basic timing generating circuit BTGEN outputs a row basic timing signal RASZ in synchronization with the active signal ACTZ or the refresh control signal REFZ. The core control circuit CCNT generates the precharge control signal PREZ, the word control signal WLZ, the sense amplifier activation signal LEZ and the column control signal CLZ sequentially in synchronization with the row basic timing signal RASZ. Generation timings of these control signals PREZ, WLZ, LEZ and CLZ are shown in FIG. 5.

FIG. 3 shows details of the refresh control circuit 12 shown in FIG. 1. The refresh control circuit 12 has a refresh generating circuit REFGEN, a pulse generating circuit PLS, a mask circuit MSK, a selector SEL, an arbiter ARB and a logic gate connected to these circuits.

The refresh generating circuit REFGEN has an oscillator which generates the internal refresh request signal RREQ0Z periodically. The pulse generating circuit PLS generates a command pulse signal COMP (test refresh request signal) having a pulse of a high logic level in synchronization with an access command (read control signal RDZ or write control signal WRZ). The mask circuit MSK outputs the command pulse signal COMP as a command pulse enable signal COMPE (test refresh request signal) when receiving the refresh mask signal RMSKZ at a low logic level, and sets the command pulse enable signal COMPE to a low logic level when receiving the refresh mask signal RMSKZ at a high logic level. Specifically, when the refresh mask signal RMSKZ is at a valid level, generation of the command pulse enable signal COMPE is prohibited even when the read command RDZ or the write command WRZ is generated.

The selector SEL outputs the internal refresh request signal RREQ0Z as a refresh request signal RREQZ when the test mode signal TMZ is at a low logic level (normal operation mode), and outputs the command pulse enable signal COMPE as the refresh request signal RREQZ when the test mode signal TMZ is at a high logic level (test mode). The arbiter ARB determines which of a read/write command signal RWZ indicating the read command RDZ or the write command WRZ and the refresh request RREQZ should be given priority, and outputs the active signal ACTV or the refresh control signal REFZ according to the order of priority.

For example, when the arbiter ARB receives the read command RDZ (RWZ) and the refresh request RREQZ at the same time, the arbiter ARB gives priority to the refresh request RREQZ. A read operation responding to the read command RDZ is suspended until a refresh operation responding to the refresh request RREQZ is completed. In reverse, when the refresh request RREQZ is supplied during a read operation, a refresh operation responding to the refresh request RREQZ is suspended until the read operation is completed. The same applies to the write command WRZ. Further, in synchronization with the refresh control signal REFZ, the arbiter ARB activates the address selection signal ASELZ indicating that the refresh operation is being executed. The address selection signal ASELZ is activated from just before the refresh operation starts until the refresh operation finishes. Thus, the arbiter ARB has a function to determine which of an access operation and a refresh operation is to be executed first when an access command conflicts with the internal refresh request signal RREQ0Z or the test refresh request signal COMPE.

Figure 4:
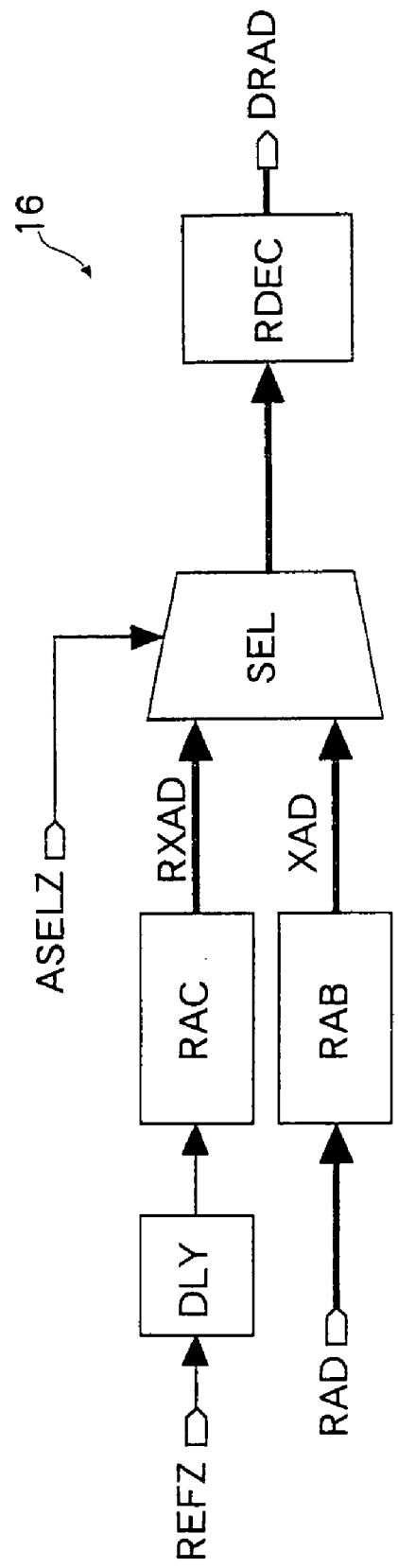
FIG. 4 is a block diagram showing details of a row address control circuit shown in FIG. 1.

FIG. 4 shows details of the row address control circuit 16 shown in FIG. 1. The row address control circuit 16 has a delay circuit DLY, a refresh address counter RAC, a row address buffer RAB, a selector SEL and a row decoder RDEC. The refresh address counter RAC counts up in synchronization with the refresh control signal REFZ delayed by the delay circuit DLY, and generates a refresh address signal RXAD sequentially. The refresh address signal RXAD is a row address signal having the same number of bits as the row address signal RAD. Note that the refresh address counter RAC may also be counted down. The delay circuit DLY is provided for updating the value of the refresh address counter RAC after the refresh operation responding to the refresh control signal REFZ is completed.

The row address buffer RAB receives the row address signal RAD and outputs the received signal as an internal row address signal XAD. The selector SEL selects the internal row address signal XAD when receiving the address selection signal ASELZ at a low logic level, and selects the refresh address signal RXAD when receiving the address selection signal ASELZ at a high logic level, and outputs a selected signal to the row decoder RDEC. The row decoder RDEC decodes the address signal supplied from the selector SEL, and outputs this signal as a row decode signal DRAD.

FIG. 5 shows the overview of operations of the semiconductor memory MEM of the embodiment. In the table, "H" denotes a high logic level and "L" denotes a low logic level, "X" denotes that either of "L" and "H" is possible, and "L/H" denotes setting to either one of "L" and "H".

When the /CE signal is at an H level, the memory MEM turns to a standby state STBY, and an operation other than a refresh operation REF is not executed. When the refresh operation is executed during the standby state STBY, the refresh control signal REFZ is activated in response to activation of the refresh request signal RREQ0Z.

When the /CE signal is at an L level, the memory MEM turns to an active state, and one of a read operation RD, a write operation WR, a refresh operation REF and a mode register set operation MRS is executed. The read operation RD is executed by activation of the read control signal RDZ when the /WE signal and the /OE signal are at an H level and an L level respectively. The write operation WR is executed by activation of the write control signal WRZ when the /WE signal and the /OE signal are at an L level and an H level respectively.

The refresh operation REF is executed when the refresh request signal RREQ0Z is activated, regardless of levels of the external control signals /CE, /WE, /OE, /LB, /UB. The mode register set operation MRS is executed by activation of the mode register set signal MRSZ when, for example, both the /WE signal and the /OE signal are at an L level.

In the read operation RD, the write operation WR and the refresh operation REF, the precharge signal PREZ is inactivated in response to the external access command signals RDZ, WRZ or the internal refresh request signal RREQ0Z, and thereafter, the word control signal WLZ, the sense amplifier activation signal LEZ and the column control signal CLZ are activated sequentially. Then, in the read operation RD, read data DOUT are outputted to the data terminal DQ, and in the write operation WR, write data DIN are supplied to the data terminal DQ. In the refresh operation REF, a read data signal which is read from a memory cell MC and amplified by the sense amplifier SA is not outputted to the data terminal DQ but written back to the memory cell MC. The read operation RD finishes in response to inactivation of the /CE signal or the /OE signal. The write operation WR finishes in response to inactivation of the /CE signal or the /WE signal. The refresh operation REF finishes automatically by control of the access control circuit 10.

FIG. 6 shows a test environment of the embodiment. First, a plurality of memories MEM are formed on a semiconductor wafer WAF through a semiconductor manufacturing process. The memories MEM are tested by an LSI tester TEST before being cut off from the wafer WAF. From the LSI tester TEST, not only a control signal but also power supply voltage VDD and ground voltage VSS are supplied. The memories MEM are connected to the LSI tester TEST via, for example, a probe PRB of a not-shown probe card. In the diagram, one memory MEM is connected to the LST tester TEST, but a plurality of (four for example) memories MEM may be connected at once to the LSI tester TEST. The number of memories MEM connected to the LSI tester TEST at once depends on the number of terminals of the LSI tester TEST and the number of terminals of a memory MEM. In this embodiment, the refresh mask signal RMSKZ is supplied from the LSI tester TEST together with the control signals /CE, /WE, /OE, /UB, /LB and the address signal AD.

Figure 7:
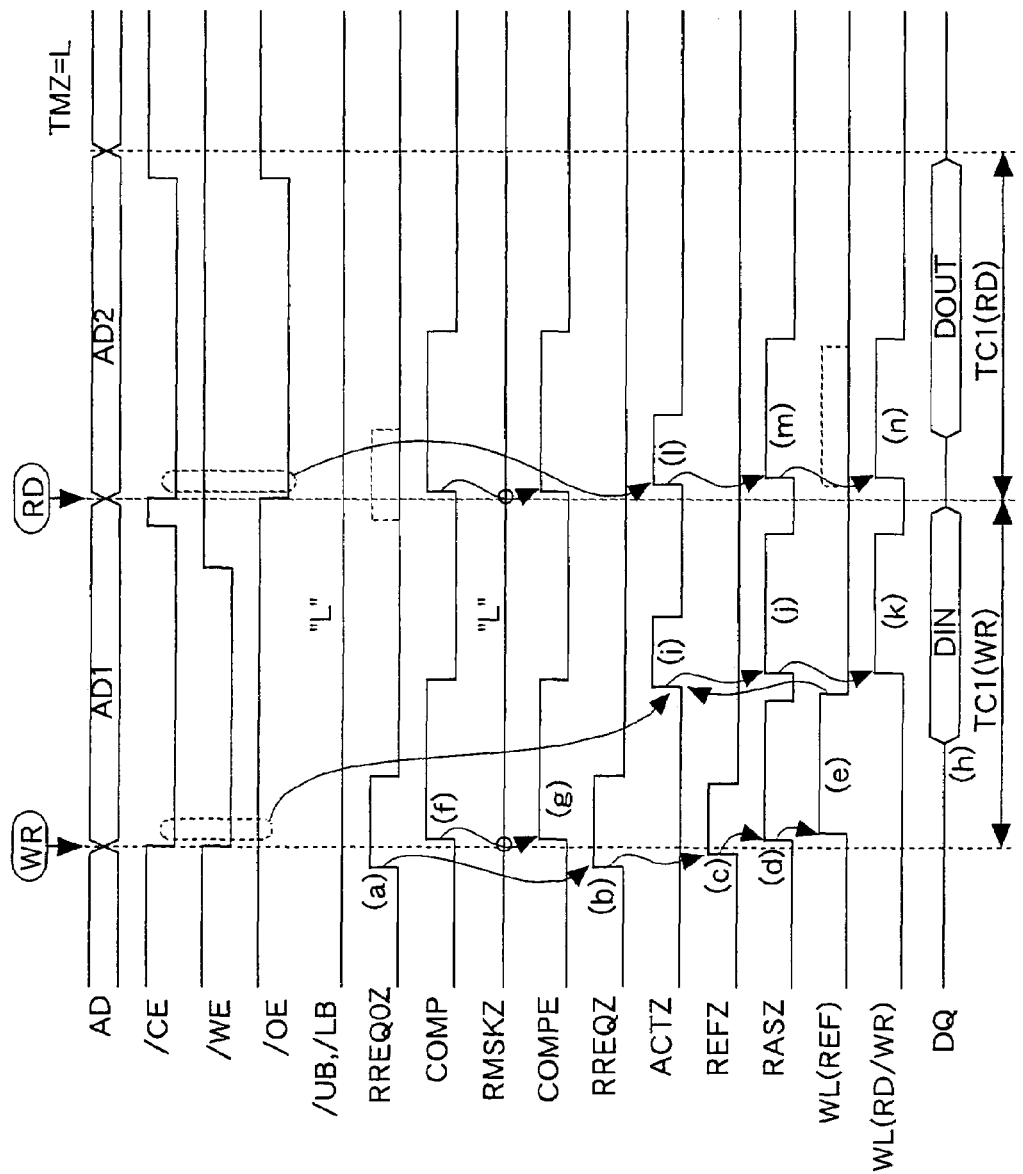
FIG. 7 is a timing chart showing operations of the memory in a normal operation mode in the embodiment.

FIG. 7 shows operations of the memory MEM in a normal operation mode (TMZ=L) in the embodiment. In this example, a write command WR and a read command RD are supplied sequentially to the memory MEM. A write address signal AD1 is supplied in synchronization with the write command WR, and a read address signal AD2 is supplied in synchronization with the read command RD. Also, the internal refresh request signal RREQ0Z is outputted just before the write command WR is received (FIG. 7(a)). In the normal operation mode, the refresh control circuit 12 outputs the internal refresh request signal RREQ0Z as the refresh request signal RREQZ (FIG. 7(b)). The arbiter ARB determines to execute the refresh request with higher priority than the write command WR, and outputs the refresh control signal REFZ (FIG. 7(c)). The access control circuit 10 outputs the row basic timing signal RASZ in response to the refresh control signal REFZ (FIG. 7(d)). Then, the word line WL is activated and the refresh operation REF is executed (FIG. 7(e)). The refresh operation REF is executed using the refresh address signal RXAD generated by the refresh address counter RAC.

The refresh control circuit 12 outputs a command pulse signal COMP in response to the write command WR (FIG. 7(f)). Since the refresh mask signal RMSKZ is fixed to a low logic level L, the command pulse enable signal COMPE is outputted in response to the command pulse signal COMP (FIG. 7(g)). However, in the normal operation mode, by the function of the selector SEL of the refresh control circuit 12, the refresh request signal RREQZ will not be outputted in response to the command pulse enable signal COMPE.

After the write command WR is supplied, the write data signal DIN is supplied to the data terminal DQ (FIG. 7(h)). The arbiter ARB outputs the active signal ACTZ in response to finish of the refresh operation REF (FIG. 7(i)). The access control circuit 10 outputs the row basic timing signal RASZ in response to the active signal ACTZ (FIG. 7(j)). Then, the word line WL is activated, and the write operation WR is executed (FIG. 7(k)). The write operation WR finishes by inactivation of the /CE signal.

A specification of the write access cycle time required for one write operation WR is TC1. The access cycle time TC1 is an external timing specification which the system accessing the memory MEM has to conform, and indicates a minimum supply interval of the write command WR or the read command RD. The memory MEM in this embodiment is designed to be capable of executing one write operation WR and one refresh operation REF within the access cycle time TC1. Thus, the system accessing the memory MEM needs not to be conscious of a refresh operation and can access the memory MEM as an SRAM.

Next, the read command RD is supplied. The internal refresh request signal RREQ0Z is generated, for example, once in a few μs to a few tens of μs. Accordingly, in FIG. 7, conflict of the read command RD with the refresh request does not occur. Since the internal refresh request signal RREQ0Z has not occur, the arbiter ARB outputs the active signal ACTZ in response to the read command RD (FIG. 7(l)). Thereafter, similarly to the write operation WR, the row basic timing signal RASZ is outputted (FIG. 7(m)), the word line WL is activated, and the read operation RD is executed (FIG. 7(n)). The read operation RD finishes by inactivation of the /CE signal. The access cycle time required for one read operation RD is TC1, similarly to the write operation WR. The memory MEM in this embodiment is designed to be capable of executing one read operation RD and one refresh operation REF within the access cycle time TC1, similarly to the write operation WR.

Note that when the internal refresh request signal RREQ0Z occurs not just before the write command WR but just before the read command RD as shown by a dashed line in the drawing, the refresh operation REF is executed just before the read operation RD. Timings of the refresh operation REF and the read operation RD at this time are the same as the above described (b) to (k) except the data signal DQ. The read data signal DOUT is outputted in synchronization with activation of the not-shown column control signal CLZ after the word line WL is activated along with the read operation RD.

FIG. 8 shows one example of operations of the memory MEM in the test mode (TMZ=H) in the embodiment. Detailed explanations of the same operations as those in FIG. 7 are omitted. In this example, the write command WR and the read command RD are supplied sequentially to the memory MEM. The write address signal AD1 and the read address signal AD2 are the same as those in FIG. 7. As described above, the selector SEL of the refresh control circuit 12 prohibits output of the refresh control signal REFZ in response to the internal refresh request signal RREQ0Z during the test mode. The refresh control signal REFZ can be generated in response to the write command WR or the read command RD during the test mode.

In this example, the refresh control signal REFZ is not generated in response to the write command WR but generated in response to the read command RD. The LSI tester TEST which tests the memory MEM sets the refresh mask signal RMSKZ to a high logic level (valid level) in synchronization with supply of the write command WR (FIG. 8(a)), so as to prevent generation of the refresh control signal REFZ in response to the write command WR. More particularly, the high logic level period of the refresh mask signal RMSKZ is set including the high logic level period of the command pulse signal COMP. Thus, generation of the command pulse enable signal COMPE is prohibited, and hence the refresh request signal RREQZ is not generated (FIG. 8(b)). Since execution of the refresh operation REF is prohibited, the write operation responding to the write command WR is executed at the same timing as the read operation responding to the read command RD shown in FIG. 7. Specifically, the write operation is executed just after the write command WR (FIG. 8(c)). In FIG. 8, since the refresh operation is prohibited, a specification of the access cycle time required for the write operation WR is set to TC2, which is shorter than the access cycle time TC1. Specifically, the specification of the access cycle time TC2 when the refresh mask signal RMSKZ is at the valid level is set shorter than the specification of the access cycle time TC1 in the normal operation mode by the time in which the refresh operation is not executed.

Next, the read command RD is supplied, and the command pulse signal COMP is outputted in synchronization with the read command RD (FIG. 8(d)). At this time, the refresh mask signal RMSKZ is set to a low logic level (invalid level) by the LSI tester TEST. Accordingly, the command pulse enable signal COMPE is outputted in synchronization with the command pulse signal COMP (FIG. 8(e)), and the refresh request signal RREQZ is outputted (FIG. 8(f)). The refresh request RREQZ and the read command RD occur at substantially the same time, and thus the arbiter ARB outputs the refresh control signal REFZ first, and outputs the active signal ACTZ thereafter (FIG. 8(g, h)), similarly to the write operation in FIG. 7. Then, the refresh operation REF and the read operation RD are executed sequentially (FIG. 8(i, j)). Specifically, the specification of the access cycle time TC1 when the refresh mask signal RMSKZ is at the invalid level is set equal to the access cycle time TC1 in the normal operation mode.

FIG. 9 shows another example of operations of the memory MEM in the test mode (TMZ=H) in the embodiment. Detailed explanations of the same operations as those in FIG. 7 and FIG. 8 are omitted. In this example, the read command RD and the write command WR are supplied sequentially to the memory MEM. The read address signal AD2 and the write address signal AD1 are the same as those in FIG. 7.

In this example, the refresh control signal REFZ is not generated in response to the read command RD, but generated in response to the write command WR. The LSI tester TEST which tests the memory MEM sets the refresh mask signal RMSKZ to a high logic level in synchronization with the supply of the read command RD (FIG. 9(a)), so as to prevent generation of the refresh control signal REFZ in response to the read command RD. Thus, execution of the refresh operation REF is masked. The read operation responding to the read command RD is executed at the same timing as the read operation responding to the read command RD shown in FIG. 7 and FIG. 8. However, similarly to the write operation WR of FIG. 8, the access cycle time required for the read operation RD is TC2, which is shorter than the access cycle time TC1.

Next, the write command WR is supplied, and the command pulse signal COMP is outputted in synchronization with the write command WR (FIG. 9(b)). At this time, the refresh mask signal RMSKZ is set to a low logic level by the LSI tester TEST. Accordingly, the command pulse enable signal COMPE is outputted in synchronization with the command pulse signal COMP (FIG. 9(c)), and the refresh request signal RREQZ is outputted (FIG. 9(d)). The refresh request RREQZ and the write command WR occur at substantially the same time, and thus the arbiter ARB executes the refresh operation REF first, and executes the read operation RD thereafter (FIG. 9(e, f)), similarly to FIG. 7.

As shown in FIG. 8 and FIG. 9, in this embodiment, the refresh mask signal RMSKZ is set to a high logic level in synchronization with the access command WR or RD during the test mode. Thus, execution of the refresh operation REF in synchronization with the access command WR, RD can be masked. Therefore, the specification of the access cycle time required for the access operation (write operation WR in FIG. 8, read operation RD in FIG. 9) is TC2, which is shorter than the access cycle time TC1. The access cycle time TC2 is equal to a time obtained by subtracting a time taken for one refresh operation (activation period of the RASZ signal) from the access cycle time TC1. Specifically, the access cycle time TC2 is slightly longer than a half of the access cycle time TC1. As a result, a test time for testing the memory MEM can be shortened.

Figure 10:
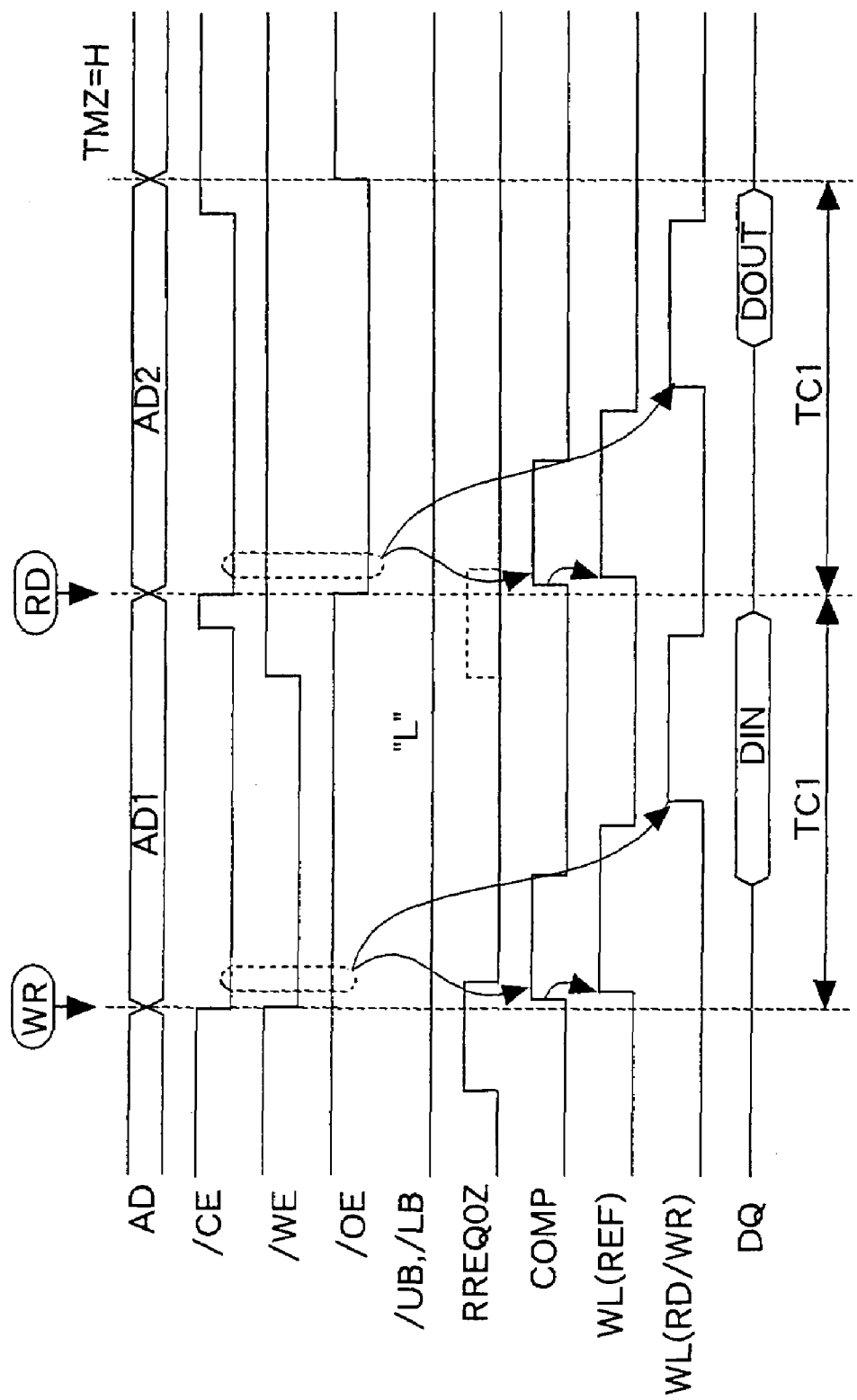
FIG. 10 is a timing chart showing one example of operations in a test mode prior to the present invention.

FIG. 10 shows one example of operations in a test mode prior to the present invention. Detailed explanations of the same operations as those in FIG. 7-FIG. 9 are omitted. In the test mode prior to the present invention, the command pulse signal COMP is generated for every write command WR and read command RD. Accordingly, the refresh operation is always executed in response to the write command WR and the read command RD. Therefore, the access cycle time required for one write operation and one read operation is always TC1, similarly to the normal operation mode.

In general, testing of the memory MEM is performed by writing test data in a large number of memory cells MC and comparing thereafter data read from the large number of memory cells MC with expected values (written test data). On the other hand, in the normal operation mode, one access operation (write operation or read operation) is executed by approximately 50-100 ns for example, and the refresh operation is executed once in a few μs to a few tens of μs in response to the refresh request signal RREQ0Z. Specifically, the refresh operation is executed once in 10,000 access operations for example. Prior to the present invention, the refresh operation is executed for every access operation during the test mode, and hence was wasteful. By applying the present invention, the refresh operation only needs to be executed once in 10,000 access operations for example. When an access operation for which the refresh operation is not executed can be executed by 60 ns, a test time of 400 μs (10,000 times of 40 ns) can be saved by 10,000 access operations.

As above, in this embodiment, whether or not to execute the refresh operation in synchronization with the access command RD, WR during the test mode can be set according to the logic level of the refresh mask signal RMSKZ. The refresh request is masked when the refresh mask signal RMSKZ is at the valid level. Accordingly, the specification of the access cycle time TC2 in which the refresh operation is prohibited can be set shorter than the access cycle time T1 in the normal operation mode. Since only the refresh operation required for the test can be executed, the test time can be shortened. Consequently, the test efficiency can be improved and the manufacturing cost for a semiconductor memory can be reduced.

Figure 11:
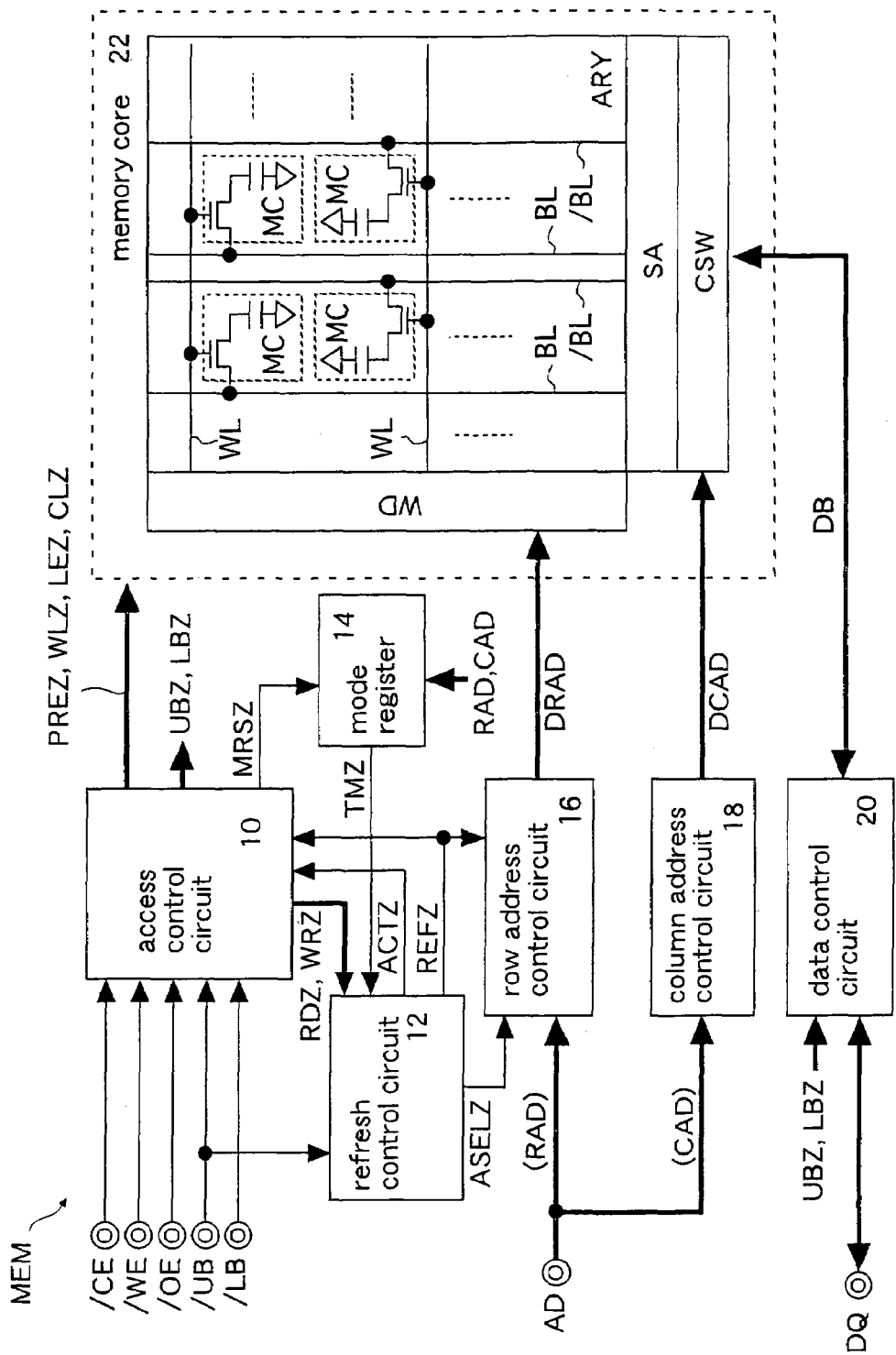
FIG. 11 is a block diagram showing another embodiment of the present invention.

FIG. 11 shows another embodiment of the present invention. The same elements as the elements explained in the previous embodiment are designated the same reference codes, and detailed explanations thereof are omitted. In this embodiment, the refresh mask terminal RMSKZ and the register R1 of the previous embodiment are deleted, and the upper-byte control signal /UB (data mask signal) received at the upper-byte control terminal /UB (data mask terminal) are supplied to the refresh control circuit 12 as the refresh mask signal RMSKZ. The other configuration is the same as in the previous embodiment. Specifically, the semiconductor memory MEM is an FCRAM for example.

Figure 12:
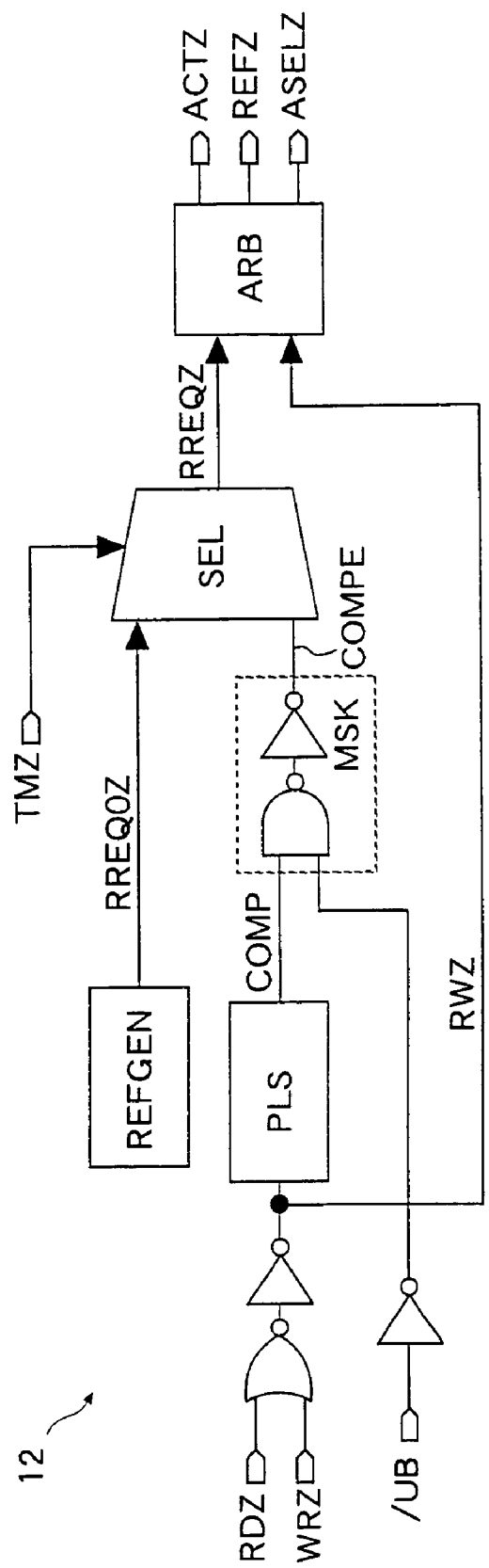
FIG. 12 is a block diagram showing details of an access control circuit shown in FIG. 11.

FIG. 12 shows details of a refresh control circuit 12 shown in FIG. 11. The circuit configuration of the refresh control circuit 12 is the same as the refresh control circuit of the previous embodiment. However, the mask circuit MSK receives not the inverted logic of the refresh mask signal RMSKZ but the inverted logic of the upper-byte control signal /UB. Specifically, the mask circuit MSK sets the command pulse enable signal COMPE to a low logic level when the upper-byte control signal /UB is at a high logic level (valid level), and outputs the command pulse signal COMP as the command pulse enable signal COMPE (test refresh request signal) when the upper-byte control signal /UB is at a low logic level (invalid level). When the upper-byte control signal /UB is at a high logic level, the command pulse enable signal COMPE is not activated when the read command RDZ or the write command WRZ is generated. Thus, the upper-byte control signal /UB functions as a refresh mask terminal which receives the refresh mask signal RMSKZ during the test mode. Other operations are the same as those in the previous embodiment. Note that the high level period (valid level period) of the test refresh request signal COMP generated in synchronization with the access command RD or WR can be set shorter than the pulse generating circuit PLS. Specifically, the high level period of the test refresh request signal COMP can be made sufficiently shorter than a supply period of the access command RD or WR (low logic level period of the /OE signal or the /WE signal). Since the valid level period (mask period) of the refresh mask signal RMSKZ (/UB) can be made shorter, it is possible to securely prevent overlapping of the input/output period of a data signal DQ and the valid level period of the refresh mask signal RMSKZ, as shown in FIG. 13 and FIG. 14 which will be explained later.

Note that the refresh control circuit 12 may receive the data control signal UBZ outputted from the access control circuit 10, instead of the refresh mask signal RMSKZ. In this case, the data control signal UBZ is supplied directly to the mask circuit MSK without intervention of an inverter.

Figure 13:
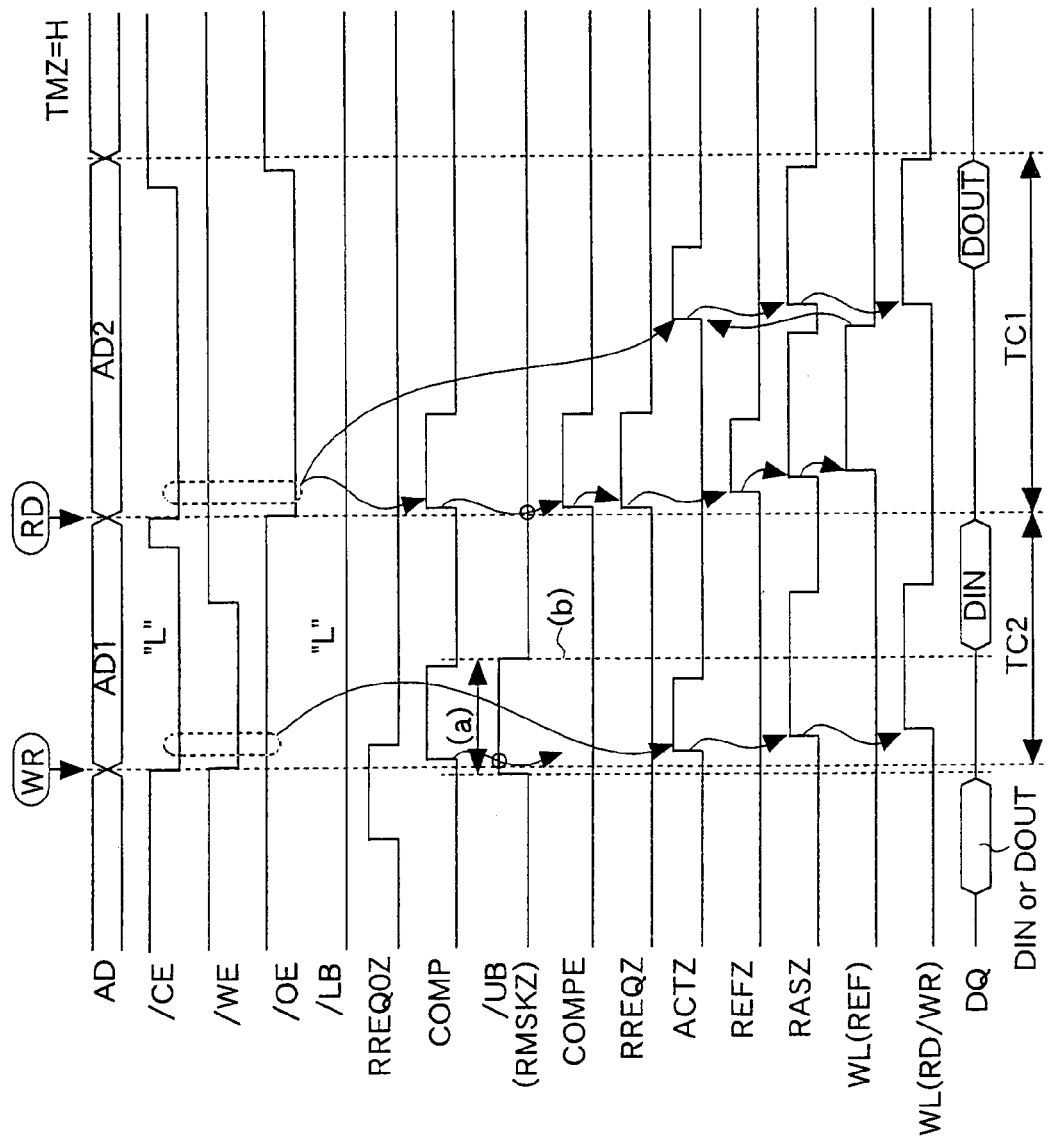
FIG. 13 is a timing chart showing one example of operations of the memory in a test mode in the other embodiment.
Figure 14:
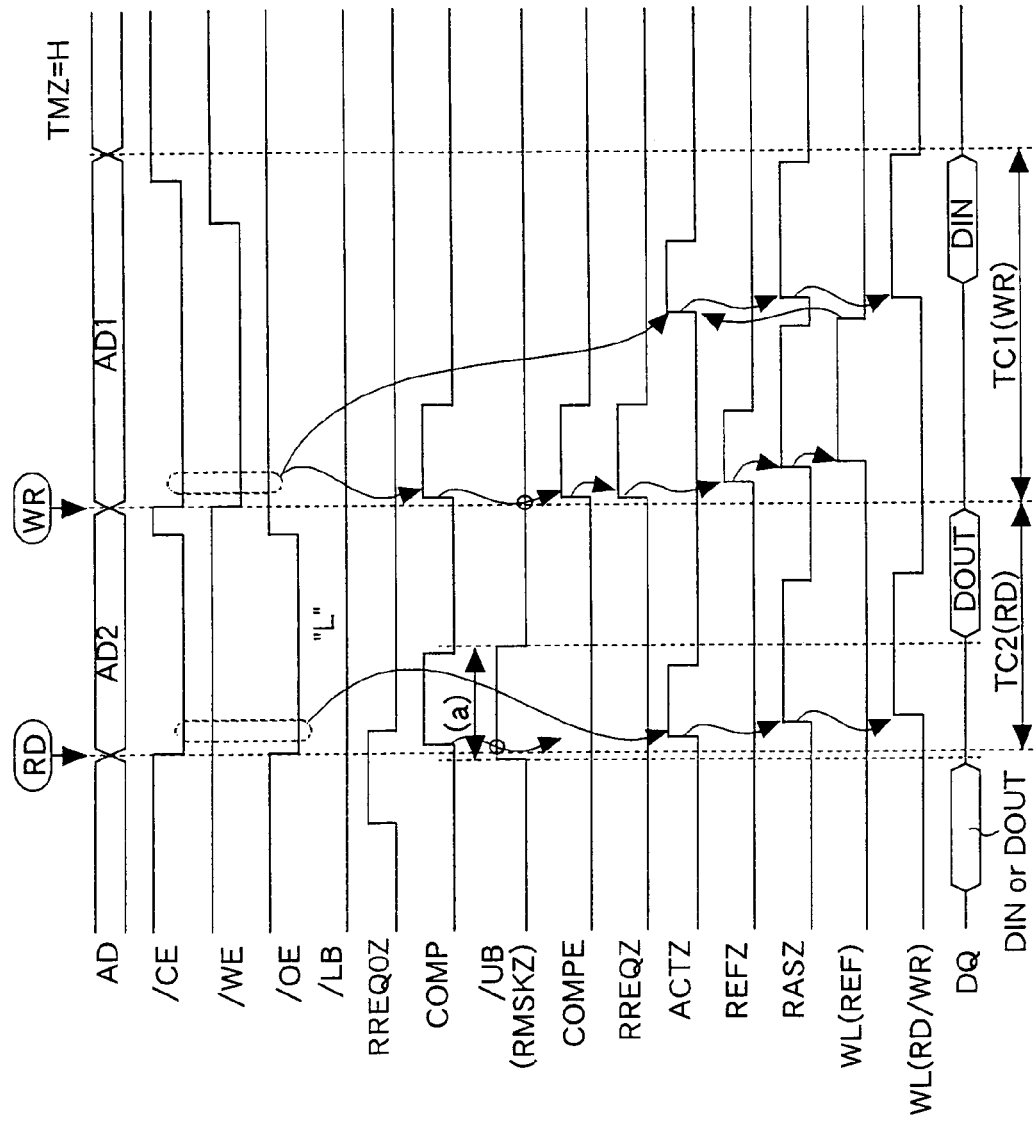
FIG. 14 is a timing chart showing another example of operations of the memory in the test mode in the other embodiment.

FIG. 13 shows one example of operations of the memory MEM in the test mode (TMZ=H) in this embodiment. Detailed explanations of the same operations as those in the previous embodiment (FIG. 7 and FIG. 8) are omitted. In this example, a refresh request during the test mode is masked by the refresh mask signal RMSKZ received at the upper-byte control terminal /UB. The waveform of the upper-byte control signal /UB is the same as the waveform of the refresh mask signal RMSKZ shown in FIG. 8 except that a valid level period (FIG. 13(a)) is different. Waveforms of other signals are the same as the waveforms in FIG. 8.

In general, in a semiconductor memory, a data signal DQ is inputted or outputted after receiving the access command WR, RD according to the operation of the memory core. When the access command WR, RD is supplied, the data signal DQ is not transmitted to the data terminal, and hence the upper-byte control signal /UB can be reused as a signal other than the mask signal of the data signal DQ (namely, the refresh mask signal RMSKZ) during a supply period of the access command WR, RD. In this embodiment, the upper-byte control terminal /UB functions as a terminal to receive the refresh mask signal RMSKZ when receiving the access command WR, RD, and functions as a terminal to receive the data mask signal /UB which masks the data signal DQ inputted/outputted to the data terminal DQ after receiving the access command WR, RD.

A finish timing of receiving the access command WR, RD is, for example, a falling edge of the upper-byte control signal /UB (FIG. 13(b)). Note that when the write data signal DQ7-15 is masked, the upper-byte control signal /UB is set to a high logic level during the supply period of the write data signal DQ7-15. The same applies to the lower-byte control signal /LB.

In this embodiment, it is necessary that the valid level period (high logic level period) of the upper-byte control signal /UB for masking the refresh operation does not overlap with the supply period of the data signal DOUT, DIN to the data terminal DQ. Particularly, it is necessary that the valid level period of the upper-byte control signal /UB for masking the refresh operation is set including the high logic level period of the command pulse signal COMP, and hence it is necessary that the command pulse signal COMP falls before start of the supply of the write data signal DIN. However, as explained with FIG. 12, the command pulse signal COMP is set to a short valid level period by the pulse generating circuit PLS. Accordingly, it is possible to securely prevent overlapping of the input/output period of the data signal DQ with the valid level period of the refresh mask signal RMSKZ (/UB). The same applies to an operation example of FIG. 14.

FIG. 14 shows another example of operations of the memory MEM in the test mode (TMZ=H) in this embodiment. Detailed explanations of the same operations as those in the previous embodiment (FIG. 7 and FIG. 9) are omitted. Also in this example, a refresh request during the test mode is masked not by the refresh mask signal RMSKZ but by the upper-byte control signal /UB. The waveform of the upper-byte control signal /UB is the same as the waveform of the refresh mask signal RMSKZ shown in FIG. 9 except that a valid level period (FIG. 14(a)) is different. Waveforms of other signals are the same as the waveforms shown in FIG. 8.

Figure 15:
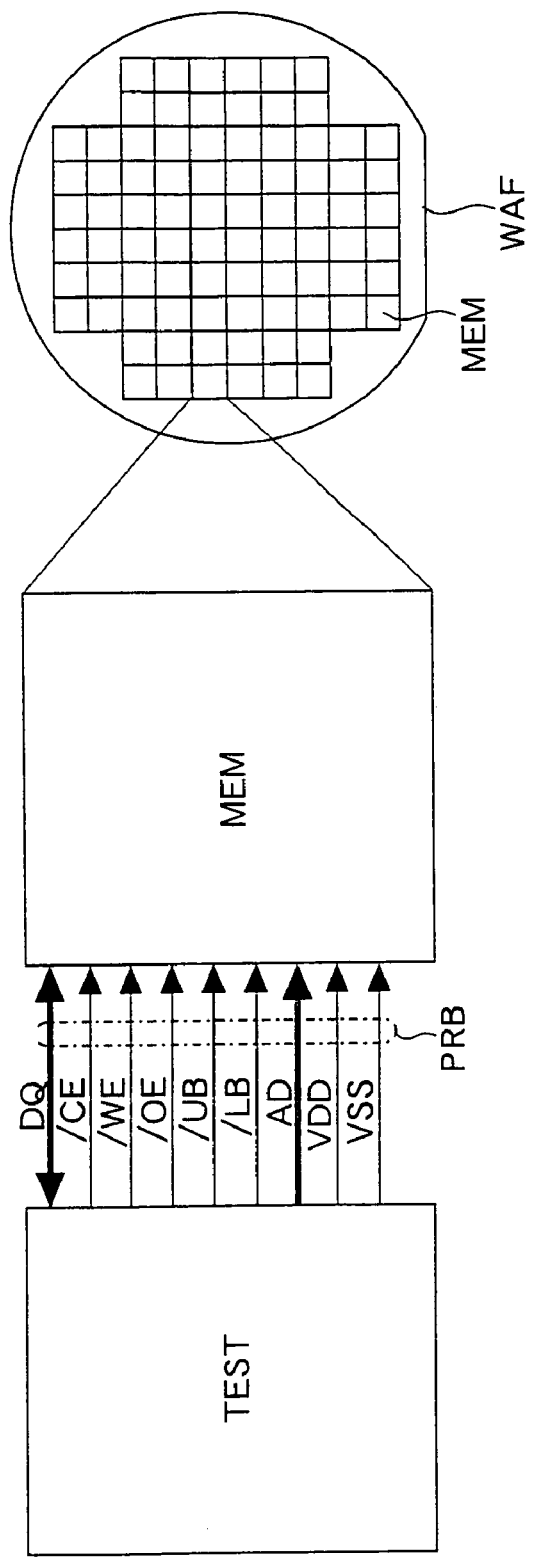
FIG. 15 is a block diagram showing a test environment of the other embodiment.

FIG. 15 shows a test environment of this embodiment. A difference from the previous embodiment (FIG. 6) is that the refresh mask signal RMSKZ is not supplied from the LSI tester TEST to the memory MEM. The other configuration is the same as in FIG. 6. In this embodiment, the refresh operation can be masked using the upper-byte control signal /UB during the test mode. Accordingly, the number of terminals of the LSI tester TEST used for one memory MEM becomes smaller than in the previous embodiment. Thus, it is possible for example to increase the number of memories which can be connected to the probe card at once. In other words, it is possible to use an inexpensive LSI tester TEST with a small total number of terminals to test the memory MEM. Consequently, a test cost for the memory MEM can be reduced.

As above, also in this embodiment, the same effect as in the above described in the previous embodiment can be obtained. Further, in this embodiment, since the number of external signal lines required when testing the memory MEM can be reduced, the test cost can be reduced.

During the test mode, not only the function as a data mask terminal, the upper-byte control terminal /UB is enabled to function also as a refresh mask terminal to receive the refresh mask signal RMSKZ. Using the upper-byte control terminal /UB as a multipurpose terminal for the data mask signal and the refresh mask signal RMSKZ, the dedicated terminal to receive the refresh mask signal RMSKZ can be dispensed with. Thus, without increasing the chip size of the semiconductor memory MEM, only the refresh operation needed for a test can be executed, and hence the test efficiency can be improved. Consequently, not only reduction of the manufacturing cost due to the shortening of the test time, but also reduction of the manufacturing cost due to the reduction of the chip size can be realized.

Note that in the above-described embodiments, there is explained an example of applying the present invention to a pseudo SRAM with an asynchronous clock. The present invention is not limited to such an embodiment. For example, the present invention may be applied to a pseudo SRAM of synchronous clock type. In this case, an access command is supplied in synchronization with a transition edge of the clock signal. The refresh mask signal RMSKZ is supplied in synchronization with a transition edge of the clock signal at which the access command is supplied.

In the above-described embodiments, there is explained an example in which the operation mode of the memory MEM is switched to the normal operation mode or the test mode by rewritten a set value of the mode register 14. The present invention is not limited to such an embodiment. For example, a dedicated test command which is not used for a normal access operation may be prepared so as to make the memory MEM enter the test mode from the normal operation mode according to the test command. At this time, as the test command, there may be prepared a test entry command to enter the test mode and a test exit command to return to the normal operation mode from the test mode. Alternatively, using the fact that the memory MEM starts with the normal operation mode when the power is turned on, preparation of the test exit command may be omitted. Further, a dedicated test terminal may be provided so as to make the memory MEM enter the test mode when a valid level is supplied to the test terminal. In this case, the test terminal is formed as a test pad to be contacted by a probe of an LSI tester, similarly to the refresh mask terminal RMSKZ shown in FIG. 1.

In the above-described embodiments, there is explained an example of applying the present invention to a semiconductor memory having a data terminal DQ used for both input and output. The present invention is not limited to such an embodiment. For example, the present invention may be applied to a semiconductor memory having an input-dedicated data terminal and an output-dedicated data terminal.

In the above-described latter embodiment, there is explained an example in which the upper-byte control terminal /UB is enabled to function also as a terminal to receive the refresh mask signal RMSKZ during the test mode. The present invention is not limited to such an embodiment. For example, the same effect can be obtained by enabling the lower-byte control signal /LB to function as a terminal to receive the refresh mask signal RMSKZ.

Figure 16:
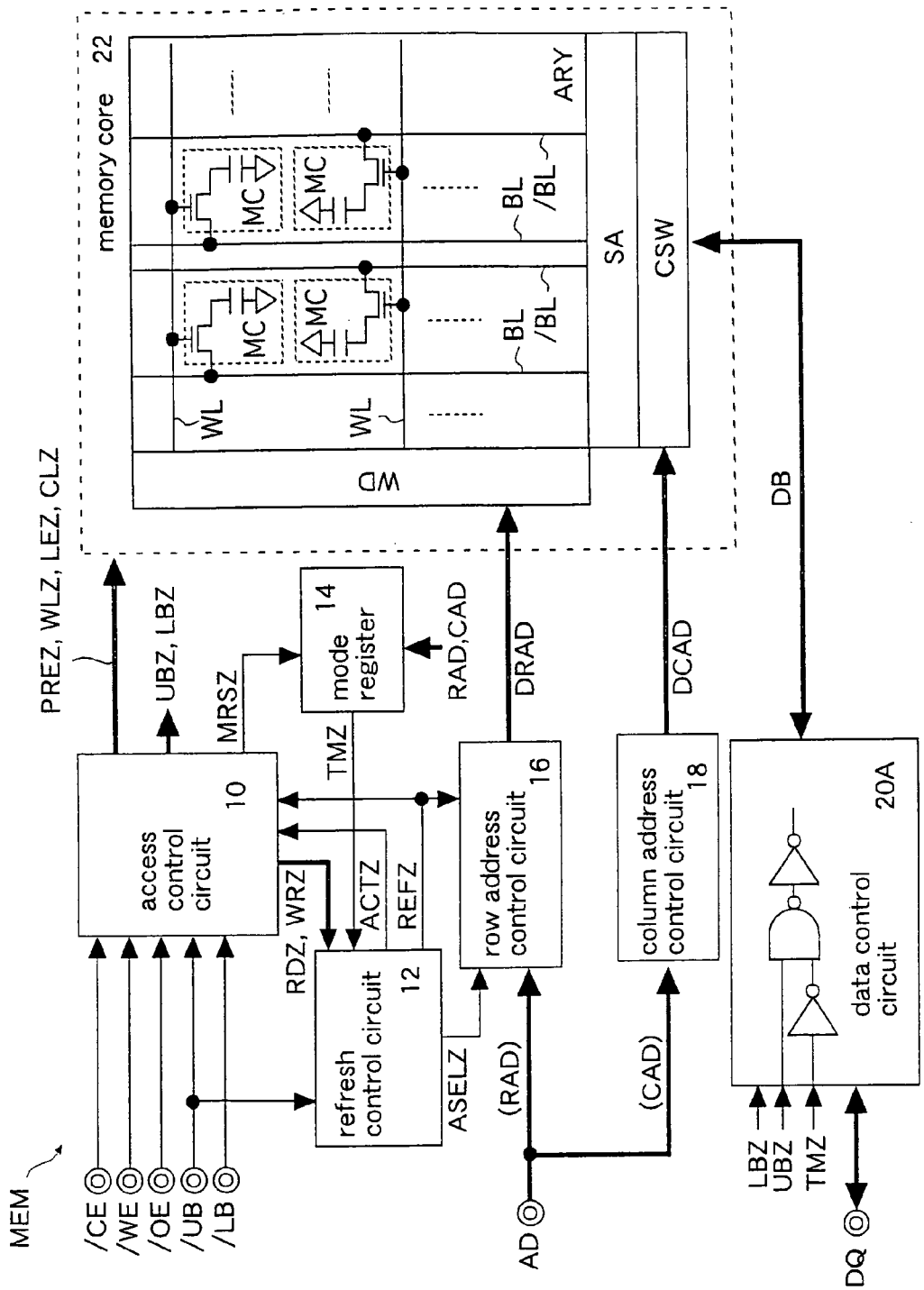
FIG. 16 is a block diagram showing an example of enabling a data mask terminal to function as a dedicated terminal to receive a refresh mask signal during the test mode.

Further, a plurality of test modes may be provided so as to enable the upper-byte control terminal /UB to function as a dedicated terminal to receive the refresh mask signal RMSKZ during the test mode using the refresh mask signal RMSKZ. FIG. 16 shows an example of the semiconductor memory MEM in which this invention is applied. In this case, during the test mode, the data control circuit 20 receives the test mode signal TMZ at a high logic level, prohibits acceptance of the upper-byte control signal /UB, and prohibits that the data signal DQ is masked by the upper-byte control signal /UB. Note that reception of the lower-byte control signal /LB may be prohibited during the test mode.

The inventions explained in the above embodiments are organized and disclosed as appendices.

The present invention can be applied to a semiconductor memory having memory cells of DRAM and an interface of SRAM.

A proposition of the embodiments is to improve test efficiency by executing only a refresh operation needed for a test.

Another proposition of the embodiments is to improve test efficiency by executing only a refresh operation needed for a test without providing a dedicated test terminal.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A semiconductor memory comprising:
    a memory cell array having dynamic memory cells;
    an access control circuit which accesses the memory cells in response to an access command which is supplied externally;
    a refresh mask terminal which receives a refresh mask signal supplied according to the access command; and
    a refresh control circuit which generates, during a test mode, a test refresh request signal in synchronization with the access command so as to execute a refresh operation of the memory cells when the refresh mask signal is at an invalid level, and prohibits generation of the test refresh request signal when the refresh mask signal is at a valid level.

2. The semiconductor memory according to claim 1, wherein the refresh mask terminal is a dedicated terminal to receive only the refresh mask signal.

3. The semiconductor memory according to claim 1, further comprising:
    a data terminal to or from which a data signal is inputted or outputted; and
    a data mask terminal which receives a data mask signal which masks a data signal inputted to or outputted from the data terminal, wherein
    the data mask terminal functions as the refresh mask terminal which receives the refresh mask signal when the access command is received during the test mode, and the refresh control circuit operates according to the refresh mask signal supplied to the mask terminal.

4. The semiconductor memory according to claim 3, wherein a valid level period of the refresh mask signal supplied to the data mask terminal is set to a period which does not overlap with a transmission period of the data signal inputted to or outputted from the data terminal.

5. The semiconductor memory according to claim 3, wherein the refresh control circuit comprises:
   a pulse generating circuit which generates a pulse signal as the test refresh request signal in response to the access command; and
   a mask circuit which prohibits reception of the pulse signal when the refresh mask signal is at the valid level.

6. The semiconductor memory according to claim 3, further comprising a data control circuit which inputs or outputs a data signal from or to the data terminal and masks a data signal according to the data mask signal, wherein the data control circuit prohibits masking of a data signal by the data mask signal during the test mode.

7. The semiconductor memory according to claim 1, wherein:
   a specification of an access cycle time which is a minimum supply interval of the access command is set to a time in which one refresh operation can be executed in addition to one read operation or one write operation during a normal operation mode; and
   during a test mode, a specification of an access cycle time when the refresh mask signal is at the invalid level is set equal to the access cycle time of the normal operation mode, and a specification of an access cycle time when the refresh mask signal is at the valid level is set shorter than the access cycle time of the normal operation mode by a time in which the refresh operation is not executed.

8. The semiconductor memory according to claim 1, wherein the refresh control circuit comprises:
   a refresh generating circuit which generates periodically an internal refresh request signal for refreshing the memory cells; and
   a selector which selects the internal refresh request signal during a normal operation mode and selects the test refresh request signal during the test mode so as to execute the refresh operation.

9. The semiconductor memory according to claim 8, further comprising an arbiter which determines which of an access operation and the refresh operation is to be executed first when the access command conflicts with the internal refresh request signal or the test refresh request signal.

10. An operating method of a semiconductor memory which has a memory cell array having dynamic memory cells and accesses the memory cells in response to an access command which is supplied externally, the method comprising:
    during a test mode, receiving at a refresh mask terminal a refresh mask signal supplied according to the access command;
    generating a test refresh request signal in synchronization with the access command so as to execute a refresh operation of the memory cells when the refresh mask signal is at an invalid level; and
    prohibiting generation of the test refresh request signal when the refresh mask signal is at a valid level.

11. The operating method of the semiconductor memory according to claim 10, wherein a data mask terminal which receives a data mask signal which masks a data signal inputted to or outputted from a data terminal is enabled to function as the refresh mask terminal which receives the refresh mask signal when the access command is received during the test mode.

12. The operating method of the semiconductor memory according to claim 11, wherein a valid level period of the refresh mask signal supplied to the data mask terminal is set to a period which does not overlap with a transmission period of the data signal inputted to or outputted from the data terminal.

13. The operating method of the semiconductor memory according to claim 11, further comprising:
    generating a pulse signal as the test refresh request signal in response to the access command; and
    prohibiting acceptance of the pulse signal when the refresh mask signal is at the valid level.

14. The operating method of the semiconductor memory according to claim 11, further comprising prohibiting the masking of a data signal by the data mask signal during the test mode.

15. The operating method of the semiconductor memory according to claim 10, wherein:
    a specification of an access cycle time which is a minimum supply interval of the access command is set to a time in which one refresh operation can be executed in addition to one read operation or one write operation during a normal operation mode; and
    during a test mode, a specification of an access cycle time when the refresh mask signal is at the invalid level is set equal to the access cycle time of the normal operation mode, and a specification of an access cycle time when the refresh mask signal is at the valid level is set shorter than the access cycle time of the normal operation mode by a time in which the refresh operation is not executed.

* * * * *